(12) United States Patent
Susal

(10) Patent No.: US 6,727,859 B1
(45) Date of Patent: Apr. 27, 2004

(54) RADIATED ELECTRIC-FIELD METER

(76) Inventor: Alan L. Susal, 93 Arch St., Redwood City, CA (US) 94062

( * ) Notice: Subject to any disclaimer, the term of this patent is extended or adjusted under 35 U.S.C. 154(b) by 65 days.

(21) Appl. No.: 10/255,284

(22) Filed: Sep. 25, 2002

Related U.S. Application Data

(60) Provisional application No. 60/326,107, filed on Oct. 1, 2001.
(51) Int. Cl.[7] ............................................. G01R 29/10
(52) U.S. Cl. ........................................ 343/703; 324/72
(58) Field of Search ........................... 343/703; 324/72, 324/73, 79 R, 133, 250, 260

(56) References Cited

U.S. PATENT DOCUMENTS

| | | | | |
|---|---|---|---|---|
| 4,025,913 A | * | 5/1977 | Winn et al. ............... 340/870.1 |
| 4,272,719 A | * | 6/1981 | Niki et al. .................... 324/72 |
| 5,773,974 A | * | 6/1998 | Kraz ........................... 324/258 |
| 6,051,967 A | * | 4/2000 | Draaijer ........................ 324/72 |
| 6,556,023 B2 | * | 4/2003 | Okazaki ...................... 324/637 |

* cited by examiner

*Primary Examiner*—Hoang V. Nguyen
(74) *Attorney, Agent, or Firm*—Thomas E. Schatzel; Law Offices of Thomas E. Schatzel A Prof. Corp.

(57) ABSTRACT

A radiated electric-field meter comprises high frequency and low frequency antennas connected to a pre-amplifier with manually adjustable gain. This feeds a linear-logarithmic amplifier/detector with a mode switch for logarithmic/linear operations. A standard panel meter provides an analog reading. Red and green LED panel lights are set close together and fed opposite signals proportional to the detected field strength. As the measurements change from zero to full-scale, the relative intensities of the green and red LED's change, providing a hue change proportional to field strength. A silent vibrator can also be switched in to provide a vibrator indication of field strength and changes of field strength.

4 Claims, 3 Drawing Sheets

RADIATED ELECTRIC-FIELD METER

RELATED APPLICATIONS

This Application claims benefit of U.S. Provisional Patent Application, Ser. No. 60/326,107, filed Oct. 1, 2001, and titled RADIATED ELECTRIC FIELD MONITOR. Such is incorporated herein by reference.

BACKGROUND OF THE INVENTION

1. Field of the Invention

The present invention relates to radio field strength meters, and more particularly to portable handheld units suitable for general use by home owners, office personnel, security specialists, antenna installers, flight crews, utilities and schools.

2. Description of the Prior Art

Modern day life is awash in radio signals from all sources. Lately there has been a concern that cell phone transmissions so close to the user's body could be causing health problems. And not long ago people living near high-voltage transmission utility towers were concerned that the million-volt-plus lines could be sending out harmful radiation. People who fly in commercial airlines are aware that the flight crews want them to turn off their wireless phones and computers because emissions from them might interfere with the airplane's navigation and communication systems.

On the other hand, covert transmitters can be eavesdropping on industrial, military, and personal secrets and field strength meters and other detectors have been used for years to sweep an area clean of such bugs.

Supposing that such radio transmissions exist is one thing, but in order to do something about it the user needs to be equipped with a device that can measure signal strength and help locate the source of transmissions. However, transmitters and other sources of radiation can emit signals over a very broad part of the radio spectrum. The part between 10-MHz and 4.5-GHz is where radio and TV transmitters, cellphones, microwave ovens, garage-door openers, ham radios, police and fire radios, and many other common devices operate. So the detectors need to have a broad frequency response.

At the same time, the sources can range in power output levels from a few microwatts to a megawatt. Covert bugs can try to operate at very low levels to conserve battery life and to avoid detection. Radio and TV stations can be licensed to operate as high as a megawatt. So the detectors also need to have broad dynamic sensitivity.

SUMMARY OF THE INVENTION

It is therefore an object of the present invention to provide a radiated electric-field meter that is easy to use.

It is another object of the present invention to provide a radiated electric-field meter that can be used in the dark or used serepticiously.

Briefly, a radiated electric-field meter embodiment of the present invention comprises high frequency and low frequency antennas connected to a pre-amplifier with manually adjustable gain. This feeds a linear-logarithmic amplifier/detector with a mode switch for logarithmic/linear operations. A standard panel meter provides an analog reading. Green and red LED panel, lights are fed opposite signals proportional to the detected field strength. As the measurements change from zero to full-scale, the relative intensities of the green and red LED's change, providing a change in illumination proportional to field strength with the green LED fully illuminated at zero signal strength and the red fully illuminated at maximum signal strength. A silent vibrator can also be switched in to provide a vibrator indication of field strength and changes of field strength.

An advantage of the present invention is that a radiated electric-field meter is provided for easy operation.

Another advantage of the present invention is that a radiated electric-field meter is provided that is easy to use in the dark, from a distance, or unobtrusively.

These and other objects and advantages of the present invention will no doubt become obvious to those of ordinary skill in the art after having read the following detailed description of the preferred embodiments which are illustrated in the drawing figure.

IN THE DRAWINGS

DETAILED DESCRIPTION OF THE PREFERRED EMBODIMENT

Figure 1:
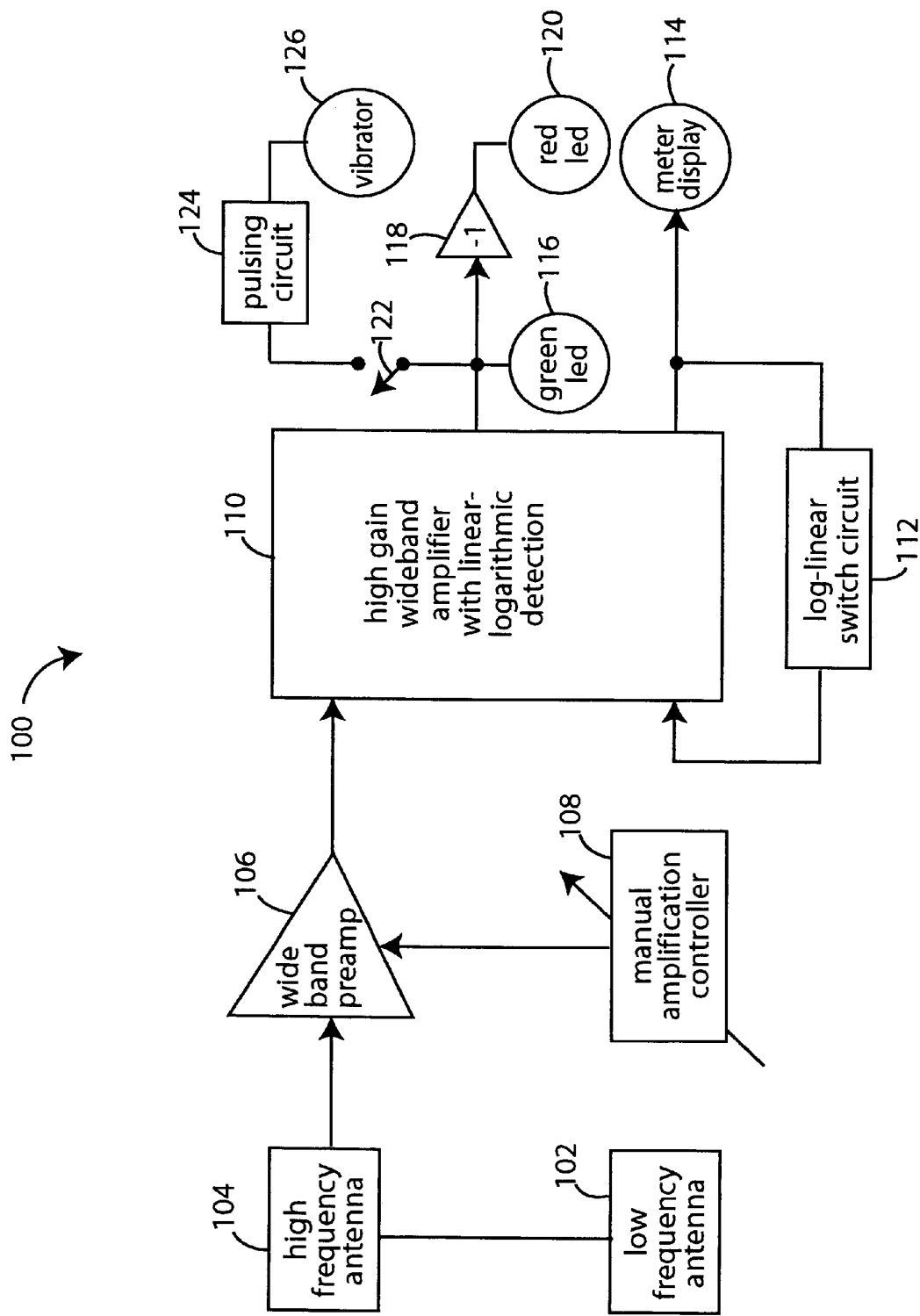
FIG. 1 is a functional block diagram of a radiated electric-field meter embodiment of the present invention.

FIG. 1 illustrates a radiated electric-field meter embodiment of the present invention, and is referred to herein by the general reference numeral 100. The meter 100 is preferably housed in a portable, battery operated device that can fit in a shirt pocket. The meter 100 includes a low-frequency antenna 102 and a high-frequency antenna 104 connected in series to the input of a wide-band pre-amplifier 106. For example, operation from 10-MHz to 4.5-GHz is desirable, so low-Q antennas with broad flat responses are preferred. A gain adjustment 108 is provided so a user can control the amount of pre-amplification to suit the signal strengths being encountered. A high-gain amplifier 110 includes linear-logarithmic detection and a switch 112 that controls whether the amplification is logarithmic or linear. The logarithmic mode can display a 1000:1 range of signal strengths. An analog panel meter 114 provides a traditional relative signal-strength readout.

A green LED 116, an inverter 118, and a red LED 120 provide a color-coded output than can be observed at long distance. The illumination levels of the two color hues is interpreted as a measure of the detected field strength.

An analog field-strength signal is used to drive the green and red LED's 116 and 120. At zero output, the green LED 116 will be fully illuminated and the red LED 120 will be dark. At half full-scale, the two LED's will be half bright. At full scale, the red LED 120 will be full bright and the green LED 116 dark. Alternative to analog drive, the LED's may be driven by pulse-width modulation since the analog response of LED's is not linear.

Sound or vibration can also be used to convey a sense of the measured field strength. If a switch 122 is closed, an analog signal output will drive a pulser 124. This in turn powers a vibrator 126 that will vibrate at rates and/or strengths proportional to the detected field strength. This could be useful in a pocket device where the vibrations or change in vibrations could call attention of a user. In alternative embodiments, the vibrator can be replaced by a loudspeaker or earphone, e.g., for instances where the user's eyes would be busy.

Figure 2:
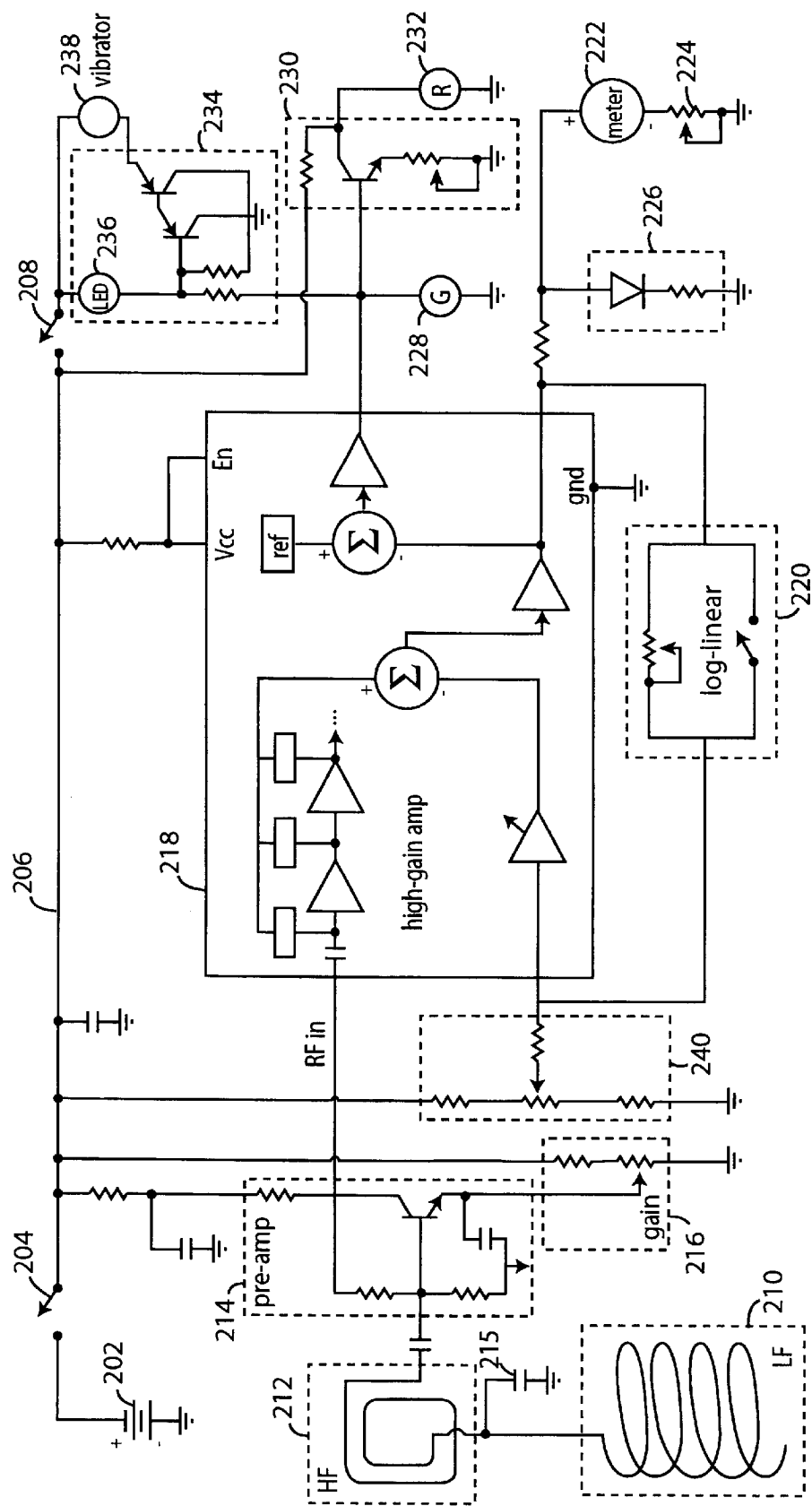
FIG. 2 is a schematic diagram of a radiated electric-field meter embodiment of the present invention, such as shown in FIG. 1.

FIG. 2 represents a portable meter embodiment of the present invention, and is referred to herein by the general reference numeral 200. The portable meter 200 generally conforms to that of FIG. 1, and here a specific circuit implementation is shown. The portable meter 200 operates with a battery 202, e.g., two AA-cells. An on-off switch 204 applies power to a main power rail 206. A switch. 208 controls on-off power to LED and vibrator displays.

A low-frequency (LF) antenna 210 is connected to a high-frequency (HF) antenna 212 and a pre-amplifier 214. At high frequencies, a capacitor 215 shunts out the LF antenna 210. A potentiometer 216 sets the pre-amp gain, and an RF input is provided to a high-gain amplifier 218. The pre-amplifier 214 can be adjusted to attenuate strong signals, or to amplify weak signals. A logarithmic-linear network 220 includes a user switch for logarithmic or linear display modes. This network controls the amount of feedback. Large amounts of feedback will cause the high-gain amplifier to have a logarithmic gain response. An analog panel meter 222 has a full-scale adjustment 224 and a protection network 226. A green (G) LED panel light 228 receives an analog output from the high-gain amplifier 218. An inverting amplifier 230 drives a red (R) LED panel light 232 opposite to the green LED. An amplifier 234 includes a blinking LED 236 and drives a silent vibrator 238. An adjustment network 240 is used to set the null point of the high-gain amplifier 218.

Figure 3:
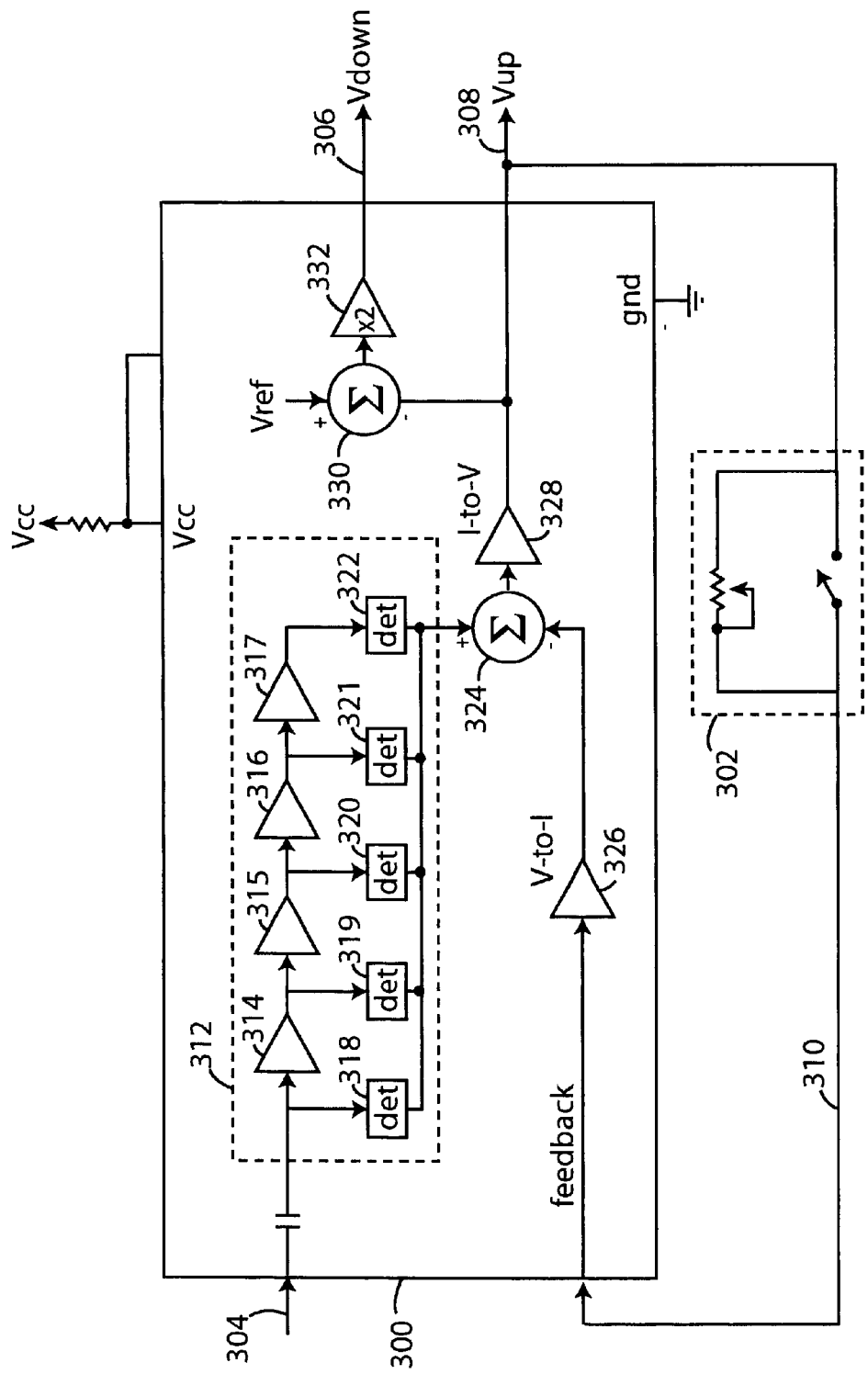
FIG. 3 is a schematic diagram of a high-gain amplifier for use in logarithmic and linear modes like that shown in FIG. 2.

FIG. 3 is a schematic diagram of a linear-logarithmic amplifier/detector 300 for use in logarithmic and linear modes like that shown in FIG. 2. A feedback network 302 includes a switch and rheostat to control the amount of feedback provided in logarithmic and linear modes of operation. A radio-frequency input 304 ultimately results in a voltage-down (Vdown) output 306 and a voltage-up (Vup) output 308. A feedback signal 310 is used to control the gain of amplifier 300. The RF input 304 is DC-decoupled by a blocking capacitor and the AC-signals are fed to a detector block 312. This includes a set of fixed-gain amplifiers 314–317 and detectors 318–322 that add together for a summed current. A summer 324 combines the detector block output with a current provided by a V-to-I converter 326. Once the currents are summed, an I-to-V converter 328 produces an analog voltage output Vup 308. A reference voltage (Vref) is added with Vup in summer 330 and amplified by a factor of two (×2) in amplifier 332. The Vdown output 306 outputs a lower and lower voltage as the detected field strength increases. In one embodiment that worked well, Vdown=2(Vref)−2(Vup), where Vref is +1.12 volts.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the "true" spirit and scope of the invention.

What is claimed is:

1. A radiated electric-field meter, comprising, an antenna system providing for reception of signals over a broad radio spectrum;

an adjustable pre-amplifier connected to the antenna system and providing for a user to manually adjust the gain;

a linear-logarithmic amplifier/detector connected to alternatively linear amplify and logarithmic-amplify signals provided by the adjustable pre-amplifier and providing an analog output related to signal levels received by the antenna system; and a panel meter display providing for a visual indication to a user of said signal levels received by the antenna system.

2. The radiated electric-field meter of claim 1, further including:

a set of different colored lights connected to an output of the linear-logarithmic amplifier/detector and arranged so their relative illumination levels indicate a detected signal strength;

wherein an apparent change of hue takes place when viewed from a distance as said analog output varies in magnitude.

3. The radiated electric-field meter of claim 1, wherein:

the set of different colored lights includes a red and a green LED and the apparent hue shift in illumination from all green at zero scale to all red at full scale with varying degrees of green and red illumination representing the range between zero and full scale detected signal magnitude.

4. The radiated electric-field meter of claim 1, further including:

a vibrator connected to an output of the linear-logarithmic amplifier/detector;

wherein the vibrator changes its magnitude of vibration as said analog output varies in magnitude.

* * * * *